United States Patent [19]

Ladany et al.

[11] 3,899,371

[45] Aug. 12, 1975

[54] METHOD OF FORMING PN JUNCTIONS BY LIQUID PHASE EPITAXY

[75] Inventors: Ivan Ladany, Stockton; Vincent Michael Cannuli, Trenton, both of N.J.

[73] Assignee: RCA Corporation, New York, N.Y.

[22] Filed: June 25, 1973

[21] Appl. No.: 373,462

[52] U.S. Cl. ................ 148/171; 148/172; 148/173; 117/201; 117/215; 252/62.3 GA

[51] Int. Cl. ................................................ H01l 7/38

[58] Field of Search ............................ 148/171–173; 252/62.3 GA; 117/201, 215

[56] References Cited

UNITED STATES PATENTS 3,741,825 6/1973 Lockwood et al. ................ 148/171

3,753,801 8/1973 Lockwood et al. ................ 148/171

*Primary Examiner*—G. Ozaki

*Attorney, Agent, or Firm*—Glenn H. Bruestle; Donald S. Cohen

[57] ABSTRACT

Two layers of a semiconductor material composed of three or more elements are deposited in succession by liquid phase epitaxy on a substrate. The layers may be of different conductivity types to form a PN junction therebetween. The layers are deposited from separate solutions containing the semiconductor material and a suitable dopant. During the deposition of the first layer from one of the solutions, both of the solutions are treated in the same manner so that the composition of the second layer is the same as that of the first layer at the junction between the layers.

5 Claims, 4 Drawing Figures

METHOD OF FORMING PN JUNCTIONS BY LIQUID PHASE EPITAXY

BACKGROUND OF THE INVENTION

The invention described herein was made in the performance of work under a NASA contract and is subject to the provisions of section 305 of the National Aeronautics and Space Act of 1958, Public Law 85-568 (72 Stat. 435; 42 U.S.C. 2457).

The present invention relates to a method of depositing on a substrate two layers of a semiconductor material in succession by liquid phase epitaxy. More particularly, the present invention relates to so depositing two layers of a semiconductor material composed of three or more elements so that the compositions of the layers are the same along the junction between the layers.

Semiconductor electroluminescent devices, in general, comprise a body of single crystalline semiconductor material having regions of opposite conductivity type forming a PN junction therebetween. Such semiconductor electroluminescent devices are generally made of the group III–V semiconductor materials and their alloys, such as the arsenides, phosphides, antimonides and nitrides of gallium, aluminum and indium and alloys thereof. For certain of these semiconductor electroluminescent devices it is desirable that the bandgap energy be the same in both of the regions along the PN junction. Since the bandgap energy is determined by the composition of the semiconductor material, it is desirable that the composition of the semiconductor material, exclusive of any dopants, along each side of the junction be the same to achieve the matching bandgap energy.

One tecnique for making the semiconductor electroluminescent devices is to epitaxially deposit on a substrate two superimposed layers of the semiconductor material with the layers being of opposite conductivity type to form the PN junction therebetween. A technique which has come into use for epitaxially depositing layers of a semiconductor material, particularly the group III–V semiconductor materials and their alloys, is known as "liquid phase epitaxy." In liquid phase epitaxy a surface of a substrate is brought into contact with a solution of a semiconductor material dissolved in a heated molten solvent. The solution is cooled so that a portion of the semiconductor material in the solution precipitates and deposits on the substrate as an epitaxial layer. The remainder of the solution is removed from the substrate. The solution may also include a conductivity modifier which deposits with the semiconductor material to provide an epitaxial layer of a desired conductivity type. U.S. Pat. No. 3,565,702 to H. Nelson, issued Feb. 23, 1971, entitled, "Depositing Successive Epitaxial Semiconductive Layers From The Liquid Phase" described a method and apparatus for depositing a plurality of epitaxial layers in succession by liquid phase epitaxy. In the method and apparatus described in this patent a plurality of solutions are provided in separate wells in a furnace boat and a substrate is brought into contact with each of the solutions in succession by means of a slide. While the substrate is in each solution, the furnace boat and its contents are cooled to deposit an epitaxial layer of the semiconductor material from the respective solution onto the substrate.

Although semiconductor electroluminescent devices can be quite satisfactorily made by the technique of liquid phase epitaxy and particularly by the method and apparatus described in the Nelson patent, a problem has arisen in using this technique for making semiconductor electroluminescent devices with semiconductor materials composed of three or more elements, such as indium gallium arsenide (InGaAs), indium gallium phosphide (InGaP), gallium arsenide phosphide (GaAsP), gallium aluminum arsenide (GaAlAs), and similar group III–V compound alloys. This problem arises from the fact that as an epitaxial layer of such a semiconductor material is deposited from a solution, the ratio of the elements in the semiconductor material of the epitaxial layer varies as the thickness of the layer increases because of change in temperature, loss of higher vapor pressure components due to evaporation and the nonuniform removal of elements from the solution by the growth. Thus, when depositing two superimposed epitaxial layers from separate solutions, the composition of the second layer will be different from the composition of the first layer along the junction between the layers so that the bandgap energies of the two layers along the junction will not be the same.

SUMMARY OF THE INVENTION

A pair of epitaxial layers of semiconductor material are deposited on a substrate by providing first and second solutions of a semiconductor material dissolved in a heated molten solvent. First and second substrates are brought into the first and second solutions respectively, so that a surface of each substrate is in contact with its respective solution. Both of the solutions are simultaneously cooled to deposit from each solution an epitaxial layer of the respective semiconductor material on the respective substrate in the solution. The substrates are then removed from the solutions and the first substrate is moved into the second solution so that the first epitaxial layer on the first substrate is in contact with the second solution. The second solution is then cooled further to deposit from the second solution a second epitaxial of the semiconductor material on the first epitaxial layer on the first substrate.

DETAILED DESCRIPTION

Figure 1:
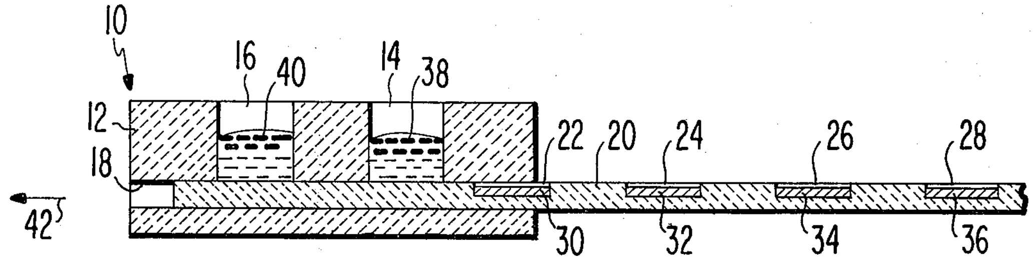
FIGS. 1–4 are cross-sectional views of an apparatus suitable for carrying out the method of the present invention and illustrating the various steps of the method.

Referring to the drawing, an apparatus suitable for carrying out the method of the present invention is generally designated as 10. The apparatus 10 comprises a refractory furnace boat 12 of an inert material, such as graphite. The boat 12 has a pair of spaced wells 14 and 16 in its upper surface. A passage 18 extends longitudinally through the boat 12 from one end to the other and extends across the bottoms of the wells 14 and 16. A slide 20 of a refractory material, such as graphite, moveably extends through the passage 18 so that the top surface of the slide forms the bottom surface of the wells 14 and 16. The slide 20 has four spaced recesses 22, 24, 26, and 28 in its upper surface. The recesses 22 and 24 are spaced apart a distance substantially equal to the spacing between the wells 14 and 16, and the recesses 26 and 28 are likewise spaced apart a distance substantially equal to the spacing between the wells. The spacing between the recesses 24 and 26 is not critical. The recesses 22 and 24 are adapted to receive source bodies 30 and 32, respectively, of a semiconductor material. The recesses 26 and 28 are adapted to receive flat substrates 34 and 36, respectively, and are large enough to allow the substrates to lie flat therein.

To carry out the method of the present invention, a first charge is placed in the well 14 and a second charge is placed in the well 16. Each of the charges is a mixture of the three or more elements composing semiconductor material of the epitaxial layer to be deposited, a metal solvent for the semiconductor material and a conductivity modifier. For example, the deposit epitaxial layers of indium gallium phosphide, the semiconductor material could be a mixture of gallium phosphide and indium phosphide. The metal solvent could be indium and the conductivity modifier could be either tellurium or tin for the N type layer or zinc, cadmium or beryllium for the P type layer. For making a semiconductor electroluminescent device by the method of the present invention, one of the charges would contain an N type conductivity modifier and the other charge would contain a P type conductivity modifier. Preferably, the proportions of the ingredients of each of the charges is such that when the metal solvent is melted to dissolve the semiconductor material, the solution will be unsaturated with the semiconductor material. Also, preferably the amount of the semiconductor material in each of the charges is the same. The source bodies 30 and 32 are of the same semiconductor material as contained in the charges. The substrates 34 and 36 in the recesses 26 and 28 are of a material suitable to receive epitaxial deposition.

The loaded furnace boat 12 is placed in a furnace tube (not shown) and a flow of high purity hydrogen is provided through the furnace tube and over the furnace boat 12. The heating means for the furnace tube is turned on to heat the contents of the furnace boat 12 to a temperature above the melting temperature of the ingredients of the charges, typically a temperature of 700°C to 900°C depending on the composition of the charges. This temperature is maintained long enough to ensure complete melting and homogenization of the ingredients of the charges. Thus, the first charge becomes a first solution 38 of the semiconductor material and the conductivity modifier in the molten metal solvent and the second charge becomes a second solution 40 of the semiconductor material and the conductivity modifier in the molten metal solvent. The method of the present invention will be described with the first solution 38 containing an N type conductivity modifier and the second solution 40 containing a P type conductivity modifier. However, these modifiers can be reversed depending on which conductivity type of epitaxial layer is to be deposited first.

Figure 2:
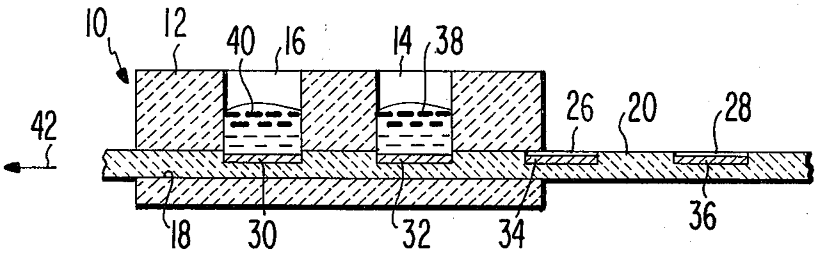
Figure 3:
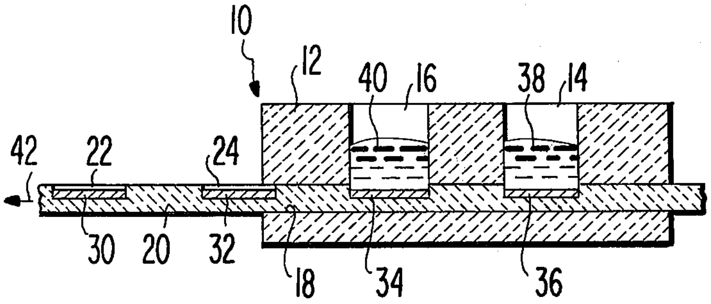

The slide 20 is then moved in the direction of the arrow 42 until the source bodies 30 and 32 are within the wells 16 and 14, respectively, as shown in FIG. 2. This brings the source body 30 into contact with the second solution 40 and the source body 32 into contact with the first solution 38. Since the solutions 38 and 40 are unsaturated with the semiconductor material, some of the semiconductor material of the source bodies 30 and 32 will dissolve in the molten metal solvent until the solutions 38 and 40 are exactly saturated with the semiconductor material. For example, in the case of indium gallium phosphide, the source bodies can be indium phosphide with phosphorous controlling the solution composition or gallium phosphide with gallium and phosphorous controlling the solution composition. The slide 20 is then again moved in the direction of the arrow 42 until the substrates 34 and 36 are within the wells 16 and 14, respectively, as shown in FIG. 3. This brings the surface of the substrate 34 into contact with the saturated second solution 40 and the substrate 36 into contact with the saturated solution 38.

The heating means for the furnace tube is then turned off or lowered in temperature to cool the furnace boat 12 and its contents. Cooling of the saturated solutions 38 and 40 causes some of the semiconductor material in the solutions 38 and 40 to precipitate and deposit on the surface of the substrates 36 and 34, respectively, to form a first epitaxial layer on each of the substrates. During the deposition of the semiconductor material, some of the conductivity modifiers in the solutions 38 and 40 become incorporated in the lattice of the first epitaxial layers to provide the first epitaxial layers with desired conductivity types. Thus, the first epitaxial layer deposited on the substrate 34 is of P type conductivity and the first epitaxial layer deposited on the substrate 36 is of N type conductivity.

Figure 4:
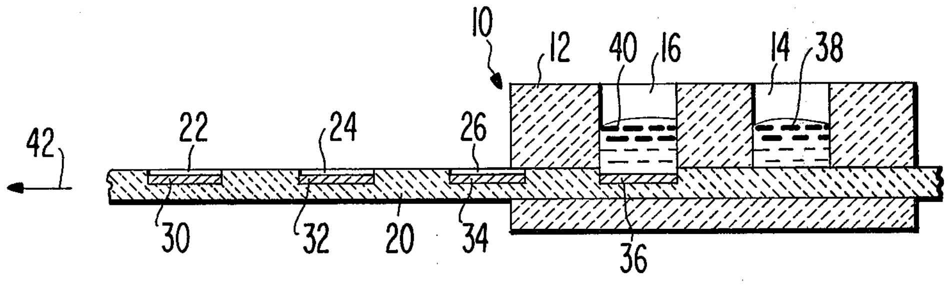

The slide 20 is now again moved in the direction of the arrow 42 to move the substrate 36 with the first N type epitaxial layer thereon from the well 14 into the well 16, as shown in FIG. 4. This brings the surface of the first N type epitaxial layer into contact with the second solution 40. The temperature of the furnace is lowered further to further cool the furnace boat 12 and its contents. This causes some of the semiconductor material in the second solution 40 to precipitate and deposit on the first N type epitaxial layer to form a second epitaxial layer on the substrate 36. Also, some of the conductivity modifier in the second solution 40 becomes incorporated in the lattice of the second epitaxial layer to provide a P type epitaxial layer of the semiconductor material on the first N type epitaxial layer.

The slide 20 is then again moved in the direction of the arrow 42 to move the substrate 36 with the two epitaxial layers thereon from the well 16. The furnace is then cooled to room temperature to permit the furnace boat to be removed from the furnace and the substrate 36 with the two epitaxial layers thereon to be removed from the furnace boat.

In the method of the present invention, the amount of the semiconductor material originally provided in each of the charges is identical and the two solutions 38 and 40 are both saturated with the semiconductor material at the same temperature so that the saturated solutions both contain the same amount of the semiconductor material. When the first solution 38 is cooled to deposit some of the semiconductor material from the first solution 38 onto the substrate 36, the second solution 40 is simultaneously cooled the same amount to deposit the same amount of the semiconductor material from the second solution 40 onto the substrate 34. Thus, after the first epitaxial layers are deposited on the substrates 34 and 36, both of the solutions 38 and 40 still contain the same ratio of the ingredients of the semiconductor material. When the deposition of the second epitaxial layer onto the substrate 36 from the second solution 40 is started, the second solution 40 contains the same amount of the semiconductor material as was contained in the first solution 38 when the deposition of the first epitaxial layer was stopped. Thus, although the ratio of the ingredients in the semiconductor layers on the substrate 36 may vary with time, thickness of deposition or previous history, the ratio of the ingredients of the semiconductor material in the two epitaxial layers will be the same at the junction between the two layers. Thus, by treating both solutions in the same manner, the ratio of the elements of the semiconductor material of the two epitaxial layers will be the same along the junction between the two epitaxial layers so that the bandgap energy of the two epitaxial layers will be the same along the PN junction between the two epitaxial layers.

We claim:

1. A method of depositing on a substrate a pair of epitaxial layers of semiconductor material comprising the steps of providing first and second solutions of a semiconductor material, having substantially the same ratio of elements, dissolved in a heated molten solvent, bring first and second substrates into contact with said first and second solutions, respectively, so that a surface of each substrate is in contact with its respective solution, cooling both of said solutions to deposit from each solution a first epitaxial layer of the respective semiconductor material on the respective substrate in the solution, such that the remaining portions of the first and second solutions have substantially equal element ratios, then removing said substrates from the solutions and moving the first substrate into the second solution so that the first epitaxial layer on the first substrate is in contact with the second solution, and then further cooling said second solution to deposit from said second solution a second epitaxial layer of the semiconductor material on the first epitaxial layer on the first substrate.

2. The method in accordance with claim 1 in which the semiconductor material in each of the solutions includes at least three elements to deposit epitaxial layers of a semiconductor material comprised of at least three elements.

3. The method in accordance with claim 2 in which one of said solutions contains a conductivity modifier of one conductivity type and the other solution contains a conductivity modifier of the opposite conductivity type.

4. The method in accordance with claim 3 including saturating each of the solutions with the semiconductor material prior to bringing the substrates into the solutions.

5. The method in accordance with claim 4 in which the solutions are saturated with the semiconductor material by bringing source bodies of the semiconductor material into contact with the solutions to allow at least some of the material of the source bodies to dissolve in the solutions.

* * * * *